Feb. 1, 1966 E. J. RYMASZEWSKI 3,233,117

HIGH SPEED LOGICAL CIRCUITS EMPLOYING
A NEGATIVE RESISTANCE DEVICE
Filed March 28, 1961

INVENTOR
EUGENE J. RYMASZEWSKI

BY Wesley De Bruin

ATTORNEY

United States Patent Office 3,233,117
Patented Feb. 1, 1966

3,233,117
HIGH SPEED LOGICAL CIRCUITS EMPLOYING A NEGATIVE RESISTANCE DEVICE

Eugene J. Rymaszewski, Poughkeepsie, N.Y., assignor to International Business Machines Corporation, New York, N.Y., a corporation of New York Filed Mar. 28, 1961, Ser. No. 98,796
10 Claims. (Cl. 307—88.5)

This invention relates to logical circuitry. More particularly, this invention is directed to a signal inverting logical block operating at extremely high speed and characterized by the voltage level of the output being compatible with the voltage level of the input.

Circuit development in the digital computer field is becoming increasingly directed toward the problem of speed with high reliability of operation. As logical techniques and programming theories advance, increases in operating speeds of the machine itself are required to render operation of the computer more versatile and less expensive. The quest for increased speed narrows itself down in part to the basic logical blocks out of which the machines are fabricated. Any speed increase achieved at this level is multiplied innumerable times when extrapolated over the entire machine organization.

Many present day computers are practically all solid state, most of the active elements being of the semi-conductor or magnetic core type. Transistors and diodes are used to provide the switching elements required in the logical circuitry of the machine, while magnetic cores are more generally used for storage and memory purposes. The transistor, when used as a switch, as is the case in logical circuitry, suffers from internal speed limitations. For example, in a junction transistor a finite time is required for minority carriers to cross the base region and start collector current flow once the emitter-base diode is forward biased. The same problem occurs in reverse when the transistor is subsequently biased into non-conduction; it takes a finite time for the minority carriers already in the base region to be "cleaned up." Attempts to reduce these turn-on and turn-off delays have followed two avenues: the internal make-up of the transistor has been varied in an attempt to reduce the transit time through the base region, and other efforts have been devoted toward modifying external circuitry to prevent or compensate for this delay. The present invention is in the latter area and enables presently available transistors to be used in logical blocks operating at speeds heretofore not achieved.

Accordingly, it is the primary object of this invention to provide a basic logical block which performs its logical function at an extremely high rate of speed and whose output voltage is compatible with its input voltage.

A further object of this invention is to provide a solid state logical circuit whose output voltage is within the same voltage range as its input voltage and operates at an inordinately high rate of speed.

A further object of this invention is to provide a high speed logical circuit rendering an output which is directly useable as an input to a like or similar logical circuit.

A further object of this invention is to provide a solid state inverter circuit operating at a high speed heretofore not attained and rendering an output having a magnitude which lies within the magnitude range within which the magnitude of the input lies.

An additional object of this invention is to provide novel means for performing both a logical function and a signal inversion in the same circuit, wherein the magnitude of the output of said circuit is within the same range of magnitude as the input of said circuit.

Still another object of this invention is to provide a novel circuit for performing the NOT-OR logical function, and said circuit being characterized by the output thereof being within the magnitude range of the input thereof, whereby the output of a first one of said novel circuits may be directly employed as the input of a second one of said novel circuits.

Yet another object of this invention is to provide a novel circuit for performing the NOT-AND logical function, and said circuit being characterized by the output thereof being within the magnitude range of the input thereof, whereby the output of a first one of said novel circuits may be directly employed as the input of a second one of said novel circuits.

A still further object of this invention is to provide a novel circuit for performing the NOT-AND logical function in accordance with this invention and a novel circuit for performing the NOT-OR logical function in accordance with this invention, and wherein the output of either of said circuits may be directly employed as the input of the other of said circuits.

Briefly, this invention comprises a transistor connected in an emitter-follower or common-collector configuration with a negative resistance device in its emitter circuit. A fixed load impedance is also connected in the emitter circuit. The transistor is continuously biased in its conducting region, conducting lightly in one condition of its input signal and more heavily in the other. The fixed load impedance is so chosen that the operating extremes of the transistor will be just beyond the negative resistance portion of the characteristic of the fixed load impedance and negative resistance device combined. Thus, when the transistor is in its lightly conducting state, the voltage drop across the negative resistance element is small and that across the fixed load impedance element is large. Conversely, when the transistor is in its highly conducting state, the voltage drop across the negative resistance element is large and that across the fixed load impedance element is small. By properly combining transistor conductivity type with polarization of the negative resistance device, inverters can be produced. Additionally, by paralleling the transistors and tying their emitters in common, additional logical functions may be performed.

The foregoing and other objects, features and advantages of the invention will be apparent from the following more particular description of preferred embodiments of the invention as illustrated in the accompanying drawings.

Figure 1:
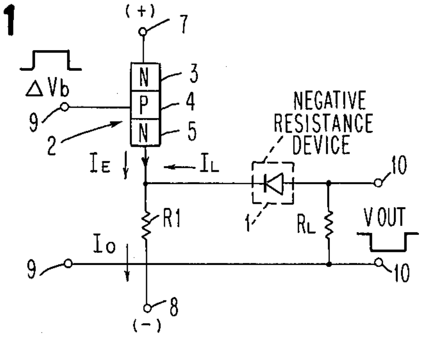
FIGURE 1 is a circuit diagram of an inverting circuit according to the invention using a NPN junction transistor.

FIGURE 1 discloses a basic inverter circuit according to the invention. Negative resistance device 1 is connected in the emitter circuit of transistor 2. Transistor 2 is shown as being of the NPN junction type having an emitter 5, base 4 and collector 3. Also connected to the negative resistance device is fixed load resistance $R_L$. A fixed resistance $R_1$ is connected between the juncture of the emitter 5 and the negative resistance device 1, and a negative voltage source 8. The collector 3 of the transistor is returned to positive voltage source 7. Signal input is provided to the base of the transistor 2 at terminals 9 and the output is taken from terminals 10, across the load resistance $R_L$.

Figures 3, 4:
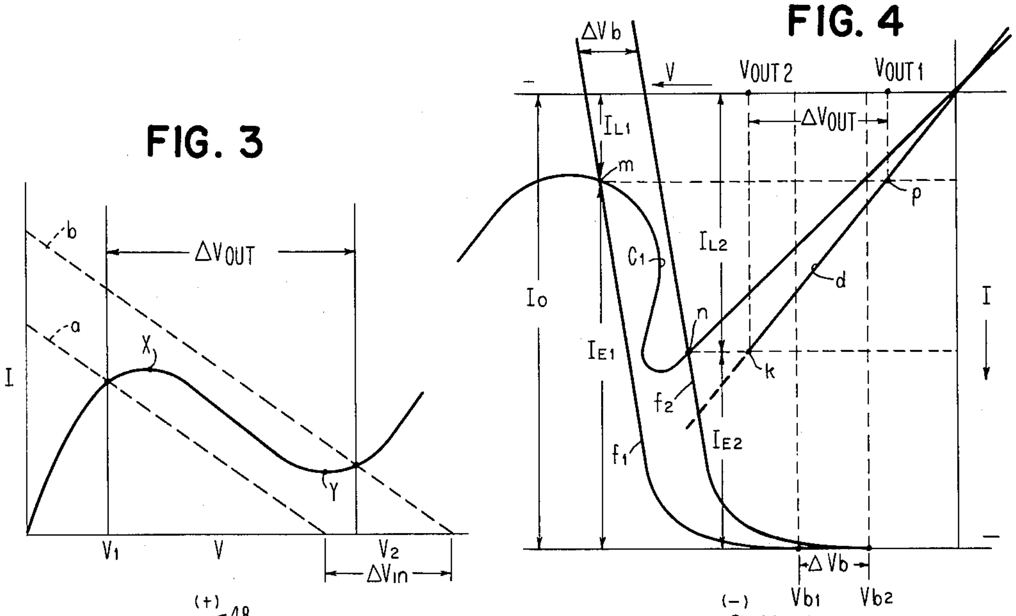
FIGURE 3 is a plot showing the negative resistance characteristic of one of the elements used in the invention.
FIGURE 4 is a graphical presentation explanatory of the mode of operation of an inverting circuit of FIGURE 1.

The current versus voltage characteristic of the negative resistance device employed in the circuit of FIGURE 1 is shown in FIGURE 3 and includes a negative resistance portion between the points X and Y. As is apparent therefrom, if the voltage applied to the device is increased through its region of negative slope, the current through the device decreases.

The lines "*a*" and "*b*" of FIGURE 3 are illustrative of the operaion of the "High Speed Inverting Circuit" disclosed and claimed in the United States patent application of Fred K. Buelow, Serial No. 835,943, filed August 25, 1959, now Patent Number 3,054,911, issued September 18, 1962, and of common assignee herewith. If in one condition the Buelow circuit in which the device is used has impedance and voltage values such that the load line is as shown by "*a*," the voltage drop across the device will be $V_1$. An increase in applied voltage $\Delta V_{in}$ will shift the load line to line "*b*." The load line now intersects the characteristic at voltage $V_2$, and the change in voltage across the device is shown as $\Delta V_{out}$. The output voltage, $\Delta V_{out}$, is considerably greater in magnitude than the change in input voltage, $\Delta V_{in}$, and therefore the device exhibits voltage amplification. One such device which exhibits this characteristic is known as the Esaki or tunnel diode. This is a heavily doped junction diode and is therefore extremely compatible for use in transistor circuits. The negative resistance characteristic is present in its forward conducting direction, the positive or anode electrode being the input terminal and the output being taken at its cathode or negative electrode. A more detailed description of this device may be found in an article by Leo Esaki appearing in the Physical Review for January 15, 1958, entitled, "New Phenomenon in Narrow Germanium P-N Junctions." It will be realized, of course, that any type of device exhibiting the negative resistance characteristic required by the circuit will be suitable.

Reference is made to the graphical presentation of FIGURE 4 in conjunction with the inverting circuit of FIGURE 1. Curve $C_1$ is the composite current versus voltage characteristic of the serial connection of the negative resistance device 1 and the load resistance $R_L$ of the inverting circuit of FIGURE 1. Curve *d* is the current versus voltage characteristic of the load resistor $R_L$. Curves $f_1$ and $f_2$ are current versus voltage characteristics of the common collector or emitter-follower circuit connection of transistor 2. With an input voltage of $V_{b1}$, the intersection of the emitter-follower characteristic $f_1$ and the composite characteristic $C_1$, namely the point labelled *m*, is the operating point or operating condition of the inverter of FIGURE 1. From an inspection of FIGURE 4, it will be seen that when the inverter circuit is operating at the point *m*, the current through the negative resistance device and load resistor $R_L$, namely $I_{L1}$, is considerably smaller than the emitter current, namely $I_{E1}$, of transistor 2. With an input voltage of $V_{b2}$, where $V_{b2}=V_{b1}+\Delta V_b$ as depicted in FIGURE 4, the intersection of the emitter-follower characteristic $f_2$ and the composite characteristic $C_1$, namely the point labelled *n*, is the operating point or operating condition of the inverter of FIGURE 1. Conversely, it is seen that when the inverter circuit is operating at the point *n* the current through the negative resistance device and load resistor $R_L$, namely $I_{L2}$, is considerably larger than the emitter current $I_{E2}$.

The outputs $V_{out\ 2}$ and $V_{out\ 1}$ are obtained by horizontally projecting from the points *m* and *n* to the points *p* and *k* on curve *d*. Further from FIGURE 4 it will be noted that for an input of $V_{b1}$, an output $V_{out\ 1}$ is obtained, whereas for an input of $V_{b2}$ an output of $V_{out\ 2}$ is obtained. Thus, it is apparent from an inspection of FIGURE 4 and in particular the magnitudes of the input and output voltages as well as the range thereof, that the circuit of FIGURE 1 is an inverter circuit whose input voltage and output voltage both lie within a given range of voltages. In other words, the input and output voltages of applicant's novel inverter are compatible in magnitude and hence the output of a first inverter may be used to drive the input of a second inverter.

The transistor 2 of the circuit of FIGURE 1 is always in a conductive state. The input levels, plus the characteristics of the circuit including the negative resistance device, are such that the transistor will be in a highly conducting state when the signal is at its more negative level and in a lightly conducting state when the input signal is at its more positive level. The voltage across the negative resistance device is thus dependent upon the positive voltage 7, the voltage drop across transistor 2, the voltage drop across the load resistor $R_L$, as well as the voltage drop across resistor $R_1$ and negative voltage 8. When the input signal is at its negative level, the transistor 2 is at the higher of its two impedance levels. By proper choice of the magnitude of voltage sources 7 and 8, the size of resistances $R_1$ and $R_L$, the circuit at this condition (input of $V_{b1}$) can be so proportioned as to operate at the point *m* of FIGURE 4. When the input signal goes positive (increases an amount $\Delta V_b$) the impedance of transistor 2 decreases, and the circuit operates at the point *n* of FIGURE 4. Briefly as seen from FIGURE 4 when the input voltage is increased from $V_{b1}$ to $V_{b2}$ (increase of $\Delta V_b$) the output is decreased from $V_{out\ 1}$ to $V_{out\ 2}$ (decrease $\Delta V_{out}$); hence the desired inversion of the output with respect to the input is obtained.

Still referring to the circuit of FIGURE 1 and to the graphical representation of FIGURE 4 it will be seen that the current through resistor $R_1$ is of the same magnitude, namely $I_0$, when the circuit of FIGURE 1 is in its "*m*" condition or its "*n*" condition. The following relationships exist: assume input voltage $=V_{b1}$, then $$I_0=I_{L1}+I_{E1}$$

output voltage $(I_{L1}R_L)=V_{out\ 1}$; and assume input voltage $=V_{b2}$, then $I_0=I_{L2}+I_{E2}$, output voltage $$(I_{L2}R_L)=V_{out\ 2}$$

where $V_{b1}<V_{b2}$ and $V_{out\ 1}>V_{out\ 2}$. Hence the circuit of FIGURE 1 functions as an inverter. It is also to be noted that $V_{out\ 2}<V_{b1}<V_{b2}<V_{out\ 1}$ and $|\Delta V_b|<\Delta V_{out}$.

It will be recognized that the above described circuit employs the common collector or emitter-follower configuration. This type of circuit presents an extremely attractive switching arrangement since the delay between output and input signals of the transistor is occasioned only by the switching time of the base-emitter diode, which is considerably shorter than the switching time of the collector-base diode. The latter causes the turn-on delay in the common-emitter circuit configuration. Additionally, because of the power gain of the emitter-follower configuration, both the logical function and power driving may be accomplished in the same stage. By introducing the negative resistance device in the emitter circuit of the transistor, the stage is permitted to provide the inversion function which is required to complete any logical system. Since a device such as the Esaki or tunnel diode is a very fast switching device, the total switching time of the resultant inverter is considerably less than that of the common-emitter type of transistor inverter. It will be realized, of course, that if power gain is of no concern, any sufficiently low impedance input circuit may be used in place of the emitter-follower to complete the inverter.

Figure 2:
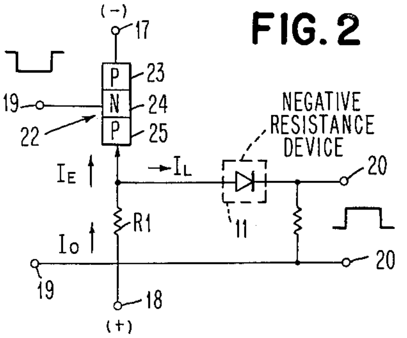
FIGURE 2 illustrates a circuit according to the invention using a PNP junction transistor.

FIGURE 2 discloses an inverter circuit according to the invention using a PNP transistor 22, as opposed to the NPN transistor 2 of FIGURE 1. The transistor, having an emitter 25, base 24 and collector 23, has its emitter connected to the negative resistance device 11, which may be of the same type as that of FIGURE 1. It is noted, however, that the polarity of the device is reversed from that of FIGURE 1. This reversal of connection is required by the characteristic of the PNP transistor so that the current flow through the negative resistance device will be in the proper direction to utilize its negative resistance characteristic. The other side of device 11 is connected via fixed load resistor $R_L$ to a point of reference potential or ground. A fixed resistance $R_1$ is connected between the juncture of the emitter 25 and the negative resistance device 11, and a positive voltage source 18. The collector 23 of the transistor is returned to negative voltage source 17. Signal input is provided to the base of the transistor 2 at terminals 19 and the output is taken from terminals 20 across the load resistance $R_L$. It is seen that except for the transistor type, which reverses the direction of current flow, and the polarity of the negative resistance device, the circuit is essentially similar to that of FIGURE 1. In view of the detailed description of the operation of the circuit of FIGURE 1, the mode of operation of the inverter circuit of FIGURE 2 is deemed to be obvious to those skilled in the art.

Figure 5:
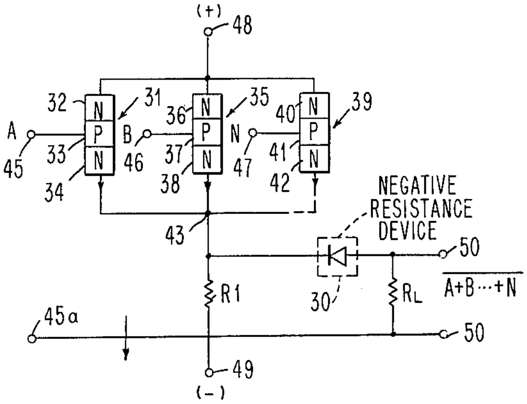
FIGURE 5 is a circuit diagram of a logical circuit utilizing the principles of this invention; and, FIGURE 6 illustrates another logical network according to the invention.

Referring to FIGURE 5, there is shown an extension of the circuit of FIGURE 1 where a logical OR function is achieved in addition to the inversion function to produce a logical stage providing a NOT-OR output. The circuit comprises transistors 31, 35 and 39, shown as being of the NPN junction type. Although three transistors are shown, the dotted line between transistors 35 and 39 indicate that any number of such transistors may be paralleled to provide an N way circuit. Transistor 31 has collector 32, base 33, and emitter 34. Similar elements are shown at 36, 37 and 38 of transistor 35 and at 40, 41, and 42 of transistor 39. The emitters are all connected to junction point 43 to which is also coupled the negative resistance device 30. A fixed load resistor is connected between the other end of negative resistance device 30 and a point of reference potential or ground. Fixed resistor $R_1$ is connected between the junction point 43 and a source of negative potential 49. Positive potential source 48 provides collector bias for all the transistors. Input signals to the bases of transistors 31, 35 and 39 are provided at terminals 45–**45*a*, 46–45*a*, and 47–45*a*, respectively. The output is taken from across the load resistor $R_L$ at terminals 50**.

Disregarding the negative resistance device 30 for a moment, it will be seen that the transistor arrangement operates as a simple OR circuit. With a positive input signal provided to one or more of the terminals 45, 46, and 47, the respective transistor or transistors will be rendered highly conductive, thereby raising the potential at the emitter point 43. Now, the negative resistance device 30 and load resistance $R_L$ operate with respect to this potential in the same manner as in the circuit of FIGURE 1. This inverts the OR function accomplished by the transistors to give an output at terminal 50 which is a NOT-OR function, expressed in Boolean algebra notation as $\overline{A+B+\ldots+N}$. Thus, by using the basic inverter teaching in combination with a simple logical network, a circuit producing an N way logical function is derived operating at a speed considerably greater than others performing the same logical function.

Figure 6:
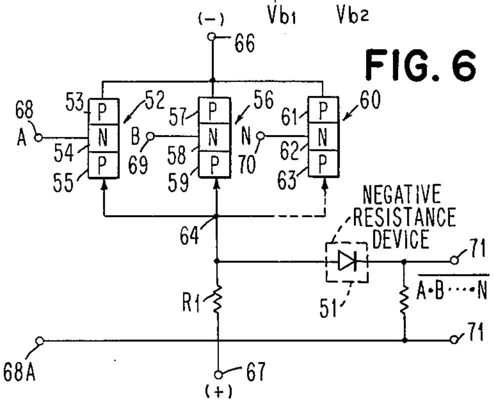

In FIGURE 6 is shown an application of the principle of this invention to perform the NOT-AND function. The circuit employs three PNP junction transistors 52, 56, and 60, having their respective emitters 55, 59, and 63 connected to a common terminal 64. Fixed resistance $R_1$ is connected between terminal 64 and a source of positive potential 67. The negative resistance device 51 and fixed load resistor $R_L$ are serially connected between terminal 64 and a source of reference potential or ground. Bias for the collectors 53, 57, and 61 of the transistors is provided by negative potential source 66. The three transistors are shown having inputs A, B, and N, connected to their respective bases 54, 58, and 62. The dotted lines between the collectors and emitters of transistors 56 and 60 and the N input to the base of transistor 60 indicate that more than three transistors may be paralleled to form an N way circuit. The output of the circuit is taken from terminals 71, across load resistor $R_L$.

Considering the paralleled transistors alone, it will be seen that the connection thereof provides a simple AND logical function. The terminal 64 will be at its more positive potential level only if all of the inputs to the transistors are at their more positive level, thereby rendering all the transistors less conductive. Should one or more of the inputs go negative, the emitter of the respective transistor, and thus the junction point 64, will also go negative. The connection of elements 51 and $R_L$ is identical to the elements 11 and $R_L$ of FIGURE 2 and function in the same manner to invert the potential appearing at point 64. Thus the output taken at terminals 71 is the inverted AND function or the NOT-AND function, $\overline{A\cdot B\cdot\ldots\cdot N}$. As the case of the NOT-OR circuit of FIGURE 5, the NOT-AND circuit of FIGURE 6 combines the rapid switching feature of the emitter-follower configuration with the rapid inversion of the negative resistance device to produce a circuit performing a logical function and an inversion at an extremely rapid rate.

By using the negative resistance device in conjunction with the emitter-follower transistor configuration, a circuit has been derived which produces a signal inversion at a speed not heretofore attained in transistor circuitry. This technique may be extended to produce logical elements of sufficient versatility to permit fabrication of entire computing machines. As stated earlier, an additional advantage of employing logical circuitry in accordance with the invention is the elimination of the D.C. translation problem since the D.C. levels of input and output fall within a predetermined range. Hence NPN type logical blocks may be used directly to drive NPN type logic blocks, or PNP type logical blocks may be used directly to drive PNP type logical blocks. Further, the logical circuitry in accordance with applicant's invention has very fast rise and fall times and a net delay less than that of a transistor inverter.

Although junction transistors have been shown, it is to be realized that other types of switching devices may be combined with the negative resistance device in accordance with the teaching of applicant's invention to obtain the desired result.

Likewise, although the Esaki or tunnel diode has been described as being a preferred type of device for the negative resistance element of the invention, it is to be understood that other devices exhibiting the requisite negative resistance characteristic may be used in its place and that these devices may be combined with other types of AND and OR circuits to provide the NOT-AND and NOT-OR functions.

While the invention has been particularly shown and described with reference to preferred embodiment thereof, it will be understood by those skilled in the art that the foregoing and other changes in form and details may be made therein without departing from the spirit and scope of the invention.

What is claimed is:

1. A binary circuit comprising:

a transistor having base, emitter and collector terminals, and a first resistor having first and second terminals, said resistors first terminal being connected to said emitter terminal;

a two terminal negative resistance device having a first terminal connected to said emitter terminal, and a second resistor having first and second terminals, said second resistor first terminal being connected to a second terminal of said negative resistance device to form an output terminal; and means connected to said collector terminal and said first and second resistor second terminals for biasing said transistor for emitter-follower operation with respect to binary voltage level signals applied to said base terminal and biasing said second resistor and said negative resistance device to produce inverted voltage levels at said output terminals that substantially equal the opposite phase voltage levels at said base terminal.

2. A circuit according to claim 1 in which said transistor is connected in a common collector configuration.

3. A circuit according to claim 1 in which said negative resistance device has a volt-ampere characteristic with a negative resistance portion between two positive resistance portions and said negative resistance device is biased by said means to operate at a point on one of said positive resistance portions or a point on the other of said positive resistance portions according to said binary voltage level signals.

4. A circuit according to claim 1 in which said negative resistance device is a tunnel diode and said means provides a positive and a negative potential for said collector terminal and said first resistor second terminal and a reference potential for said second resistor second terminal.

5. A binary logic circuit comprising:

a plurality of signal responsive variable impedances connected to a common junction, and a first fixed impedance having first and second terminals, said first fixed impedance having its first terminal connected to said junction;

a two terminal negative resistance device having a first terminal connected to said common junction, and a second fixed impedance having first and second terminals, and second impedance first terminal being connected to the second terminal of said negative resistance device to form an output terminal; and means connected to said variable impedances and said first and second fixed impedance second terminals for biasing said variable impedances to produce at said junction and in phase logic function of binary voltage level input signals and biasing said second fixed impedance and said negative resistance device to produce inverted voltage levels at said output terminal that substantially equal the opposite phase input voltage levels.

6. A circuit according to claim 5 in which said negative resistance device is a tunnel diode.

7. A circuit according to claim 5 in which said signal responsive variable imedances are transistors and in which said negative resistance device has a volt-ampere characteristic with a negative resistance portion and in which said means biases said negative resistance device to operate in a high current low voltage region in response to first level input signals to produce a second level at said output terminal and biasing said device in a low current high voltage region in response to said second level signal inputs to produce substantially said first level at said output terminal.

8. The circuit claim 7 wherein said transistors are connected to perform an OR logical function.

9. The circuit of claim 7 wherein said transistors are connected to perform an AND logical function.

10. A circuit according to claim 7 in which said negative resistance device is a tunnel diode.

References Cited by the Examiner

UNITED STATES PATENTS

| | | | |
|---|---|---|---|
| 2,962,604 | 11/1960 | Brittain | 307—88.5 |
| 2,964,652 | 12/1960 | Yourke | 307—88.5 |
| 2,975,377 | 3/1961 | Price | 307—88.5 |
| 2,998,191 | 8/1961 | Marshall | 307—88.5 |
| 3,015,733 | 1/1962 | Vignos et al. | 307—88.5 |
| 3,054,911 | 9/1962 | Buelow | 307—88.5 |

JOHN W. HUCKERT, *Primary Examiner.*